(12) United States Patent
Lehmann et al.

(10) Patent No.: US 6,665,224 B1
(45) Date of Patent: Dec. 16, 2003

(54) PARTIAL REFRESH FOR SYNCHRONOUS DYNAMIC RANDOM ACCESS MEMORY (SDRAM) CIRCUITS

(75) Inventors: Gunther Lehmann, Poughkeepsie, NY (US); Manfred Menke, Wolfratshausen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/153,042

(22) Filed: May 22, 2002

(51) Int. Cl.[7] .................................................. G11C 7/00
(52) U.S. Cl. ............. 365/222; 365/230.02; 365/230.03
(58) Field of Search ........................... 365/222, 230.03, 365/230.02, 189.02, 189.05, 230.08, 198

(56) References Cited

U.S. PATENT DOCUMENTS

| | | | |
|---|---|---|---|
| 5,331,601 A | | 7/1994 | Parris |
| 5,600,802 A | * | 2/1997 | Yazdy et al. ................. 710/301 |
| 5,875,143 A | | 2/1999 | Ben-Zvi |
| 6,064,617 A | * | 5/2000 | Ingalls ..................... 365/225.7 |
| 6,310,814 B1 | * | 10/2001 | Hampel et al. ............. 365/222 |
| 6,496,440 B2 | * | 12/2002 | Manning ............... 365/230.03 |

\* cited by examiner

Primary Examiner—Thong Le
(74) Attorney, Agent, or Firm—Slater & Matsil, L.L.P.

(57) ABSTRACT

A semiconductor dynamic random access memory (DRAM) 300 with a programmable memory refresh counter 345 is presented. The counter 345 permits the specification of portions of the DRAM 300 to be refreshed, saving power and time over DRAMs that refresh the entire memory. The counter 345 may be programmed with a wordline address at the beginning of a block of memory and subsequent refresh operations automatically increment or decrement the value in the counter. Additionally, blocks of the memory not being refreshed can be accessed (written or read), improving the utilization of the memory device.

33 Claims, 5 Drawing Sheets

PARTIAL REFRESH FOR SYNCHRONOUS DYNAMIC RANDOM ACCESS MEMORY (SDRAM) CIRCUITS

FIELD OF THE INVENTION

This invention relates generally to semiconductor memory devices, and particularly to refreshing memory storage cells in a dynamic random access memory (DRAM).

BACKGROUND OF THE INVENTION

Semiconductor devices are used for integrated circuits in a wide variety of electrical and electronic applications, such as computers, cellular telephones, radios, and televisions. One particular type semiconductor device is a semiconductor storage device, such as random access memory (RAM) and flash memory. These semiconductor storage devices use an electrical charge to store information. Most semiconductor storage devices have their storage cells arranged in a two-dimensional array with two sets of select lines, word-lines and bitlines. An individual storage cell is selected by first activating its wordline and then its bitline.

Widely used forms of RAM include dynamic RAM (DRAM) such as synchronous DRAM (SDRAM). SDRAM and DRAM memory cells store information, bits (binary digits), in the form of an electrical charge on a capacitor. Because the electrical charge on the capacitor dissipates (leaks) over time, the electrical charge must be refreshed periodically. To refresh the electrical charge on the capacitor, the electrical charge currently on the capacitor is read (detected), amplified, and then written back to the capacitor.

The majority of SDRAM memory devices available today have dedicated memory cell refresh circuits built into the memory device. These circuits normally comprise a counter that specifies a wordline, and when a refresh operation is requested by the user, the specified wordline is selected and all storage cells (capacitors) connected to the specified wordline are refreshed. After the refresh operation is complete, the counter is incremented (or decremented) depending on its particular implementation.

This approach has several disadvantages; a first being that the user does not know which wordline is being refreshed during a refresh operation and therefore must deactivate all wordlines. Second, the user cannot specify which parts of memory need to be refreshed and the entire memory is refreshed. This leads to refreshing memory cells that are not used, expending unnecessary power and time refreshing memory cells containing no data.

Alternatively, the user of an SDRAM circuit can emulate a refresh command with conventional SDRAM commands by sending an activate command to a wordline followed by a precharge (deactivate) command. This method allows the user to control which wordlines are refreshed. However, the use of this method requires the submission of two commands (an activate command followed by a deactivate command) per refresh cycle. Also, the wordline address has to be provided with each refresh cycle during the submission of the activate command.

A need has therefore arisen for a refresh circuit and method that allows the user to specify which portions of the memory storage device to refresh and to determine which wordline is being refreshed with the current operation without needed to specifically specifying the wordline with each refresh operation.

SUMMARY OF THE INVENTION

In one aspect, the present invention provides a semiconductor memory device comprising a memory comprising a plurality of memory storage cells to store binary data, a command interface coupled to the memory, the command interface containing circuitry to decode commands provided to the device by a user and provide the decoded commands to control the operation of the device, a refresh circuit coupled to the memory and the command interface, the refresh circuit to provide an address of a portion of the memory to be refreshed, the refresh circuit comprising a programmable counter having a first input coupled to the command interface and a second input coupled to an address bus, the programmable counter containing circuitry to store an address provided on the address bus and to provide the stored address on an output of the refresh circuit, and a selection circuit having an input coupled to the command interface and an output coupled to the second input of the programmable counter, the selection circuit having circuitry to pass the address provided by the address bus to the programmable counter based on a command from the command interface.

In another aspect, the present invention provides a dynamic random access memory (DRAM) device comprising a memory containing a plurality of memory cells to store binary data, each memory cell including a transistor coupled in series with a capacitor, a command interface coupled to the memory, the command interface containing circuitry to decode commands provided to the device by a user and provide the decoded commands to control the operation of the device, a refresh circuit coupled to the memory and the command interface, the refresh circuit containing circuitry to provide an address of a portion of the memory to be refreshed, wherein the command interface decodes a single external refresh command into first and second internal commands, the first internal command being a bank activate (RAS) command, activating a portion of the memory corresponding to an address received from an external address bus, and the second internal command being a precharge (PRE) command to the portion of memory refreshed by the RAS command.

In yet another aspect, the present invention provides a method for refreshing a contiguous block of memory, the method comprising the steps (a) specifying an address corresponding to a start of the contiguous block of memory, (b) issuing a first memory refresh command, (c) issuing a second memory refresh command, and (d) repeating step (c) until the contiguous block of memory is refreshed.

The present invention provides a number of advantages. For example, use of a preferred embodiment of the present invention allows the user to specify which group of memory cells of a dynamic random access memory (DRAM) device to refresh, reducing the number of memory cells to refresh when only a percentage of the DRAM is being used. This partial refresh permits a considerable savings in power consumption (reducing power dissipation and increasing battery life) and time (reducing the number of memory cells requiring refresh).

Also, use of a preferred embodiment of the present invention allows the user to specify an initial wordline address of a block of memory cells requiring refresh during the first refresh operation and in subsequent refresh operations, the user is not required to specify subsequent wordline addresses. This reduces the computation load on the user, allow it to do other tasks. In addition, it keeps the overall power consumption of the application, which includes the DRAM circuit, low. This is because only the initial wordline address is transferred, thus reducing the signal activity on the external address line.

Additionally, use of a preferred embodiment of the present invention requires only a minor modification to existing refresh circuits, including the changing the counter to a programmable counter.

Also, use of a preferred embodiment of the present invention allows the user to know the address of the particular wordline being refreshed in the refresh operation. By knowing the address of the particular wordline, the user does not have to deactivate all wordlines in the memory storage device, only wordlines inside the memory bank the wordline being refreshed. This enables the user to activate wordlines inside banks that are not being refreshed to accelerate memory accesses.

Additionally, use of a preferred embodiment of the present invention eliminates the need of the user to issue a precharge command for the bank of memory containing the refreshed memory cells. This eliminates some of the overhead involved in the refresh operation, simplifying the task performed by the user.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1:
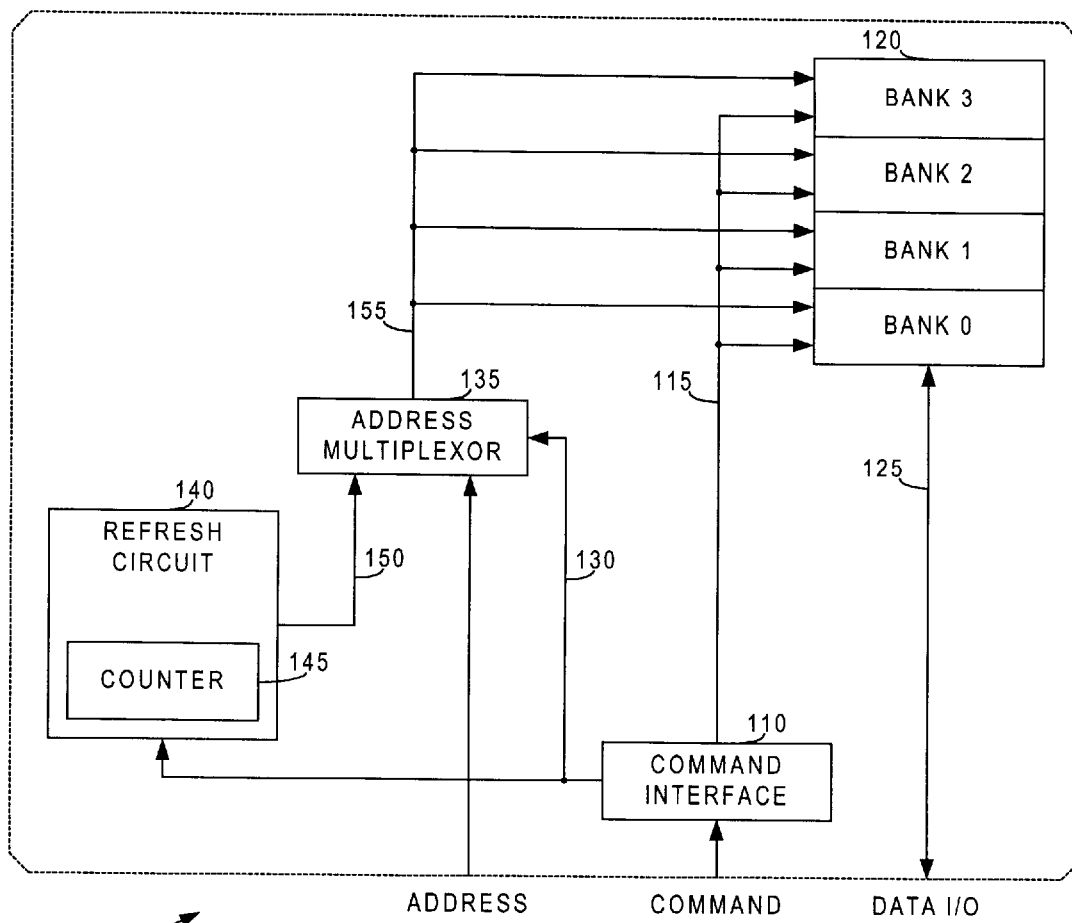
FIG. 1 illustrates a prior art memory storage device with a refresh circuit containing a counter.

Referring now to FIG. 1, a block diagram illustrates a prior art memory storage device 100 with a refresh circuit 140 with a counter 145 according to the technical standard, "PC SDRAM Specification, Revision 1.7, November 1999," which is incorporated herein by reference. The memory storage device 100 has preferably three sets of inputs; an address bus, a command bus, and a data input/output (data I/O) bus. The address bus is used by the user to specify a memory address of a particular memory storage cell or a group of cells in the memory storage device 100. The memory address may be thought of as being a combination of a wordline address along with a bitline address of the storage cell(s). The command bus permits the user to issue commands to the memory storage device 100. Commands include, but are not limited to: PRE (precharge), ACT (bank/wordline-activate), READ (read data from memory cells), NOP (No operation), etc. The data I/O bus allows the user to provide or obtain data stored in the memory storage device 100.

The memory storage device 100 includes: a command interface 110, a memory storage bank 120, an address multiplexor 135, and a refresh circuit 140. The memory storage bank 120 may, in turn, be made up of multiple memory storage banks. The command interface 110 is used to decode the command issued by the user and control the execution of the command. The command interface 110 is coupled to the memory storage bank 120 by an internal command bus 115. The internal command bus 115 provides internal commands that are decoded from user commands by the command interface 110 to the memory storage bank 120. For example, a PRE (precharge) command would result in an internal command on the internal command bus 115, causing the deactivation of a wordline in the memory storage bank 120 with an address specified by an internal address bus 155.

The refresh circuit 140 contains a counter 145. The counter 145 holds an address of a wordline and a bank number that specifies the wordline that will have its attached memory storage cells refreshed during the next refresh operation. The value in the counter 145 is incremented (or decremented) after the completion of the refresh operation to provide the address of another wordline for the next refresh operation. The address multiplexor 135 selects from an address specified by the user or one that is specified by the refresh circuit 140. The command interface 110 provides the select line 130 for the address multiplexor 135 and the address selected depends upon the command issued by the user.

As implemented, the counter 145 is neither writeable nor readable by the user. This means that the user cannot specify an address of a wordline to refresh nor can it detect the wordline that will be refreshed by the refresh operation. This results in several significant disadvantages, including the inability to refresh only the memory storage cells that are actually being used to store data and the necessity of deactivating all wordlines. By having to deactivate all wordlines, the user cannot keep memory banks activated that are not being refreshed by the current refresh operation, resulting in slower memory accesses.

According to the PC SDRAM technical standard, the user can perform a user-controlled partial refresh of the memory storage device 100 without using the existing refresh circuit 140 by using a combination of a bank activate (ACT) command and a precharge (PRE) command. Refer to the PC SDRAM technical standard for a more detailed explanation of the ACT and PRE commands.

The ACT command turns on a wordline as specified by the user in a memory bank and row address provided by the user on the address bus. The net effect of the ACT command is that the memory cells connected to the activated wordline are refreshed. The succeeding precharge command then deactivates the wordline so that other wordlines within the same memory bank can be refreshed.

Figure 2:
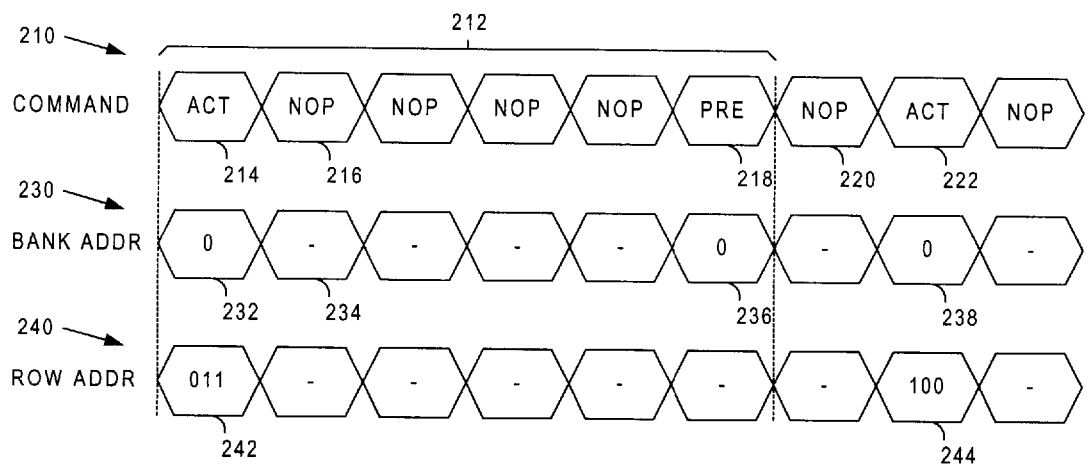
FIG. 2 illustrates a timing diagram of a memory refresh operation using the memory storage device displayed in FIG. 1.

Referring now to FIG. 2, a timing diagram illustrates the operation of ACT and PRE commands to perform a user-controlled refresh of a wordline in a memory storage device. A first timing trace 210 displays the contents of the command bus while a second timing trace 230 displays the bank address portion of the address bus and a third timing trace 240 displays the row address portion of the address bus. The refresh operation is displayed in highlight 212. To initiate the refresh operation, the user specifies the bank address and the row address of the wordline. This is done by placing the bank and row addresses on the address bus. The user then places the ACT command (block 214) on the command bus. For example, FIG. 2 displays a bank address 0 and a row address 011. Then, according to the technical specifications, the user must wait a specified number of cycles for the refresh operation to complete. According to the PC SDRAM technical specifications, the user must wait a time period that is at least equal to four command cycles. After waiting the requisite amount of time, the user must issue a PRE command to deactivate the wordline. To do so, the user places the bank address (bank 0 in the example) and issues the PRE command (block 218). The user does not need to specify the row address because the PRE command deactivates all wordlines within a single memory bank.

In the time available between the PRE command (block 218) and the beginning of the next refresh operation, the user is free to perform other operations on the memory storage device. Block 222 displays the beginning of the next refresh operation while block 220 represents a minimum amount of time between refresh operations. While the time represented by block 220 is shown as a single command cycle, in actuality, it can be greater than one command cycle. The average maximum amount of time between refresh operations in a memory device permitting partial refresh is equal to a maximum amount of time that a memory cell can retain it information divided by the number of wordlines in the memory storage cell that require refreshing, while in a memory device that does not permit partial refresh, it is divided by the total number of wordlines.

It is readily evident that while a partial refresh can be performed using commands provided by the PC SDRAM technical standard and existing memory storage cells, it is an involved operation where the user must specify the address of each wordline and then issue two commands per refresh operation.

Figure 3:
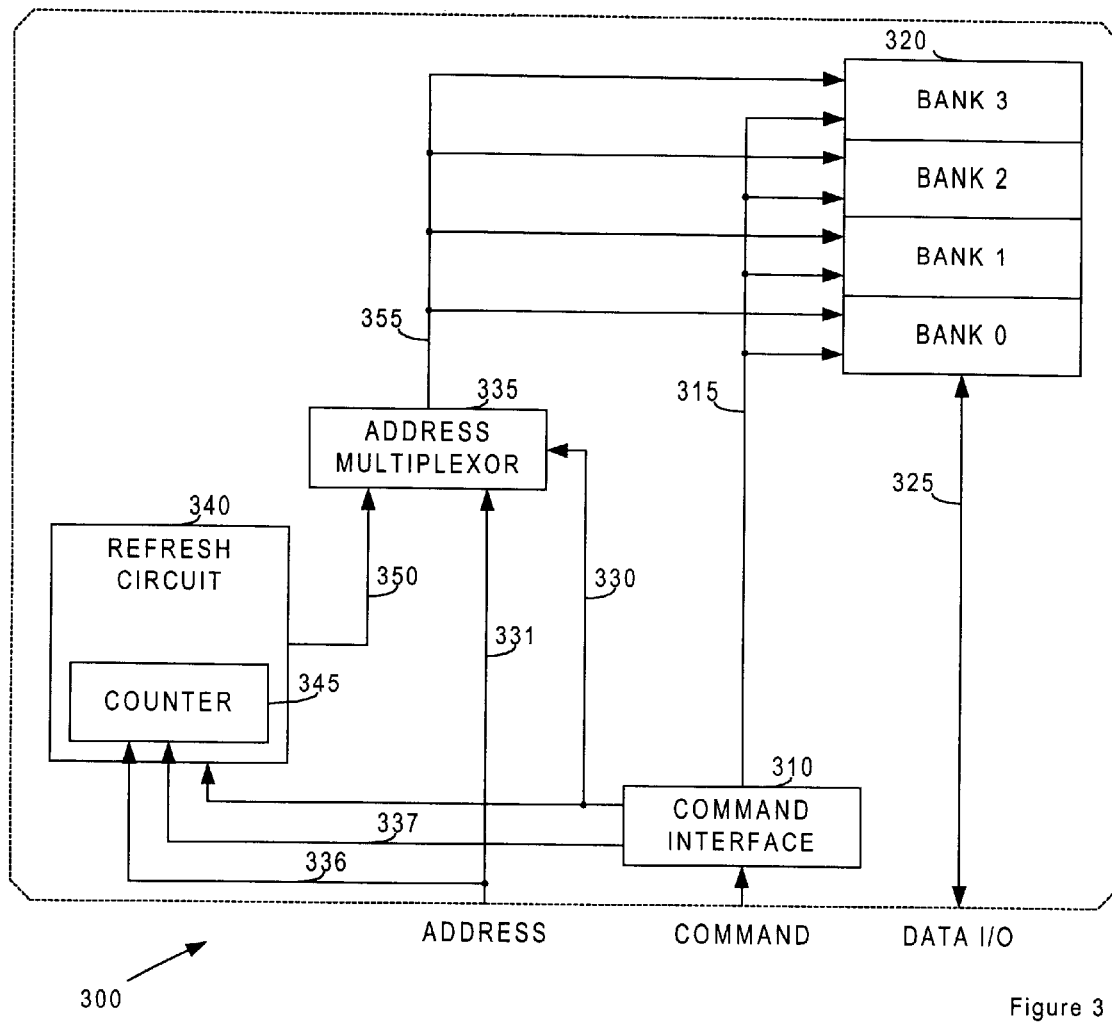
FIG. 3 illustrates a memory storage device with a refresh circuit with a programmable counter permitting user specification of a wordline to refresh during a refresh operation according to a preferred embodiment of the present invention.

Referring now to FIG. 3, a block diagram illustrates a memory storage device 300 with a refresh circuit 340 with a programmable counter 345 according to a preferred embodiment of the present invention. The memory storage device 300 is similar in operation and layout to the memory storage device 100 displayed in FIG. 1. A notable difference is that the programmable counter 345 used in place of the counter 145 (FIG. 1). Additionally, several busses are provided, connecting the programmable counter 345 to an address bus 331 and a command interface 310. A bus 336 between the address bus 331 and the programmable counter 345 allows the user to specify the contents of the programmable counter 345 by placing the desired address on the address bus 331 and issuing an appropriate command to load the programmable counter 345. A control signal bus 337 between the command interface 310 and the programmable counter 345 allows the command interface 310, upon the decoding of the appropriate command, to load the value on the address bus 331 into the programmable counter 345 by providing an appropriate load signal on the control signal bus 337.

Selection circuitry (not shown) inside the refresh circuit 340 can enable or disable a connection between the address bus 331 and the programmable counter 345 based upon signals provided by the command interface 310. When the proper signal is provided by the command interface 310 via the control signal bus 337, the selection circuitry enables the bus 336 between the address bus 331 and the programmable counter 345, resulting in the storing of an address on the address bus 331 in the programmable counter 345. When the bus 336 is disabled, the programmable counter 345 maintains the value that it currently stores. The specific command used to load the contents of the programmable counter 345 is discussed below.

A special command is used to load the programmable counter 345. The RAP (Row address strobe with Auto Precharge and load) command loads the value on the address bus 331 into the programmable counter 345, activates the wordline specified in the address (resulting in the refresh of the memory cells connected to the wordline), and then precharges the wordlines in the memory bank containing the specified wordline. According to a preferred embodiment of the present invention, the RAP command is decoded in the command interface into two separate commands. A first command being a bank activate command, similar to the RAS (or ACT) command, that activates a wordline in the memory that corresponds to an address specified in the address bus. The bank activate command also results in the address specified on the address bus being stored in the programmable counter. A second command decoded from the RAP command is a precharge (PRE) command for the particular bank of memory containing the wordline being refreshed. The decoding of a single command into two commands reduces the overall complexity placed on the user, since the user does not need to count an amount of time equal to the time required for the refresh operation to complete and issue a PRE command of its own.

According to a preferred embodiment of the present invention, a signal pin, referred to as an auto precharge control pin in SDRAM circuits, is present in the memory storage device 300. This control pin is used to indicate if an auto precharge operation should be performed at the end of a read or write command as it is known for SDRAM circuits. Additionally, in accordance with the SDRAM interface, the voltage level provided on this control pin distinguishes a precharge for one memory bank from a precharge for all memory banks command. Also, according to a preferred embodiment of the present invention, this control pin is used to indicate a bank activate command, or RAS, being executed in the memory storage device is a RAS command that is issued by the user or one that is decoded by the command interface 310 resulting from a RAP command issued by the user.

Figure 4:
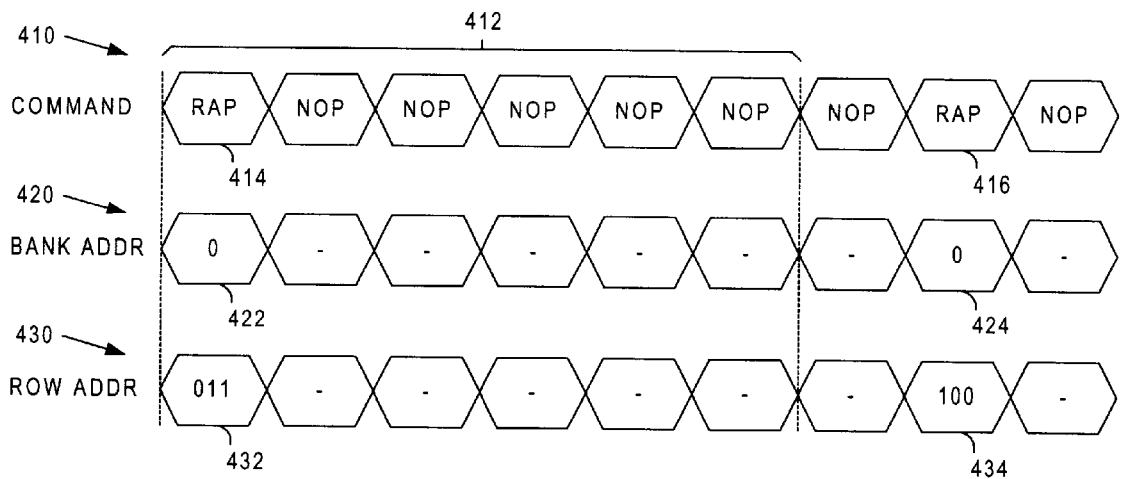
FIG. 4 illustrates a timing diagram displaying a memory refresh operation using the memory storage device displayed in FIG. 3.

Referring now to FIG. 4, a timing diagram illustrates the operation of the RAP command to perform a refresh of a wordline in a memory storage device according to a preferred embodiment of the present invention. A first timing trace 410 displays the contents of the command bus while a second timing trace 420 displays the bank address portion of the address bus and a third timing trace 430 displays the row address portion of the address bus. The refresh operation is displayed in highlight 412. The refresh operation begins when the user writes a bank address and row address of the wordline to be refreshed. The writing of the addresses is displayed in blocks 422 and 432 respectively. After providing the addresses, the user issues the RAP command (displayed in block 414). After the user issues the RAP command, the user is required to wait a prerequisite amount of time for the refresh operation to complete before the user can access memory storage cells within the memory bank. However, since the user is specifying the wordline that is being refreshed, the user knows which bank of memory the wordline resides in. Because of this knowledge, the user can access other memory cells or other wordlines residing in other memory banks. In fact, the user can perform other refresh operations. In fact, the user can perform as many overlapping refresh operations as there are memory banks in the memory storage device.

Notice that since the RAP command is decoded into two internal commands with the required PRE command being the second, the user is not required to issue its own PRE command. Continuing, FIG. 4 illustrates the beginning of a second refresh operation (displayed in block 416) where the user again specifies the address of the wordline that it wishes to refresh.

According to the PC SDRAM technical standard, a CBR (auto refresh) command is provided to refresh a wordline that is subsequent to the value stored in the counter in the refresh circuit. When used in conjunction with the RAP command discussed previously, the CBR command can be used to refresh a contiguous sequence of wordlines but only requiring the user to specify the address of only the first wordline in the sequence of wordlines.

Figure 5:
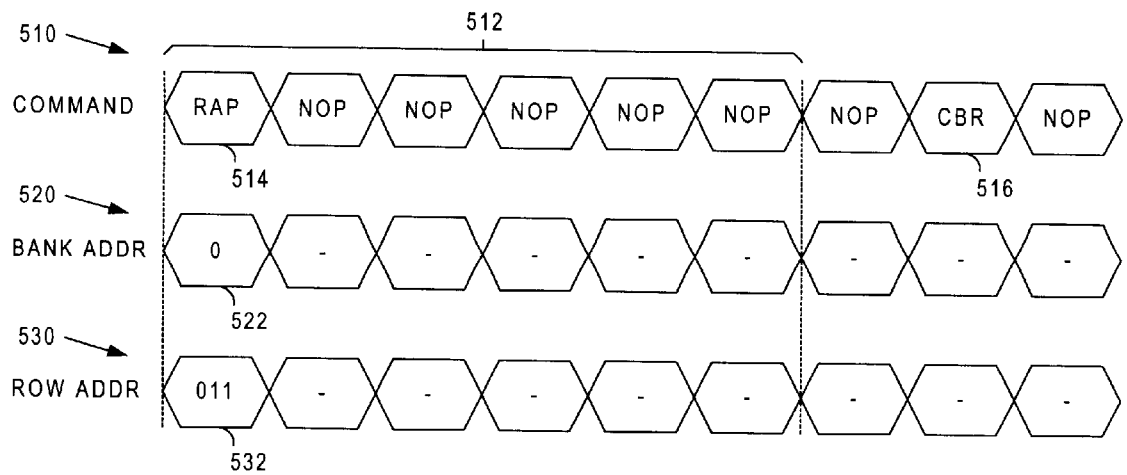
FIG. 5 illustrates a timing diagram displaying a memory refresh operation using an automatically incrementing programmable counter to refresh a contiguous block of memory according to a preferred embodiment of the present invention.

Referring now to FIG. 5, a timing diagram illustrates the operation of the RAP and CBR commands to perform a refresh of a sequence of wordlines in a memory storage device according to a preferred embodiment of the present invention. A first timing trace 510 displays the contents of the command bus while a second timing trace 520 displays the bank address portion of the address bus and a third timing trace 530 displays the row address portion of the address bus. The refresh operation is displayed in highlight 512. The refresh operation begins when the user writes a bank address and row address of the wordline to be refreshed. The writing of the addresses is displayed in blocks 522 and 532, respectively. After providing the addresses, the user issues the RAP command (displayed in block 514).

After the user issues the RAP command, the user is required to wait a prerequisite amount of time for the refresh operation to complete before the user can access memory storage cells within the memory bank containing the wordline specified in the address.

After the refresh operation initiated by the RAP command (block 514) completes, the user issues a CBR command (block 516). The CBR does not require the user to specify the address of any wordline; instead, it takes the contents of the programmable counter in the refresh circuit and increments (or decrements, depending on implementation) its value and performs a refresh operation on the wordline corresponding to the new address. For example, the RAP operation (block 514) specified a wordline with a bank address 0 and a row address 011. The CBR operation (block 516) would then refresh a wordline with a bank address 0 and a row address 100, assuming the programmable counter is implemented as an autoincrement programmable counter. The user could continue to issue more CBR commands to complete the refreshing of a contiguous block of memory storage cells.

Figure 6:
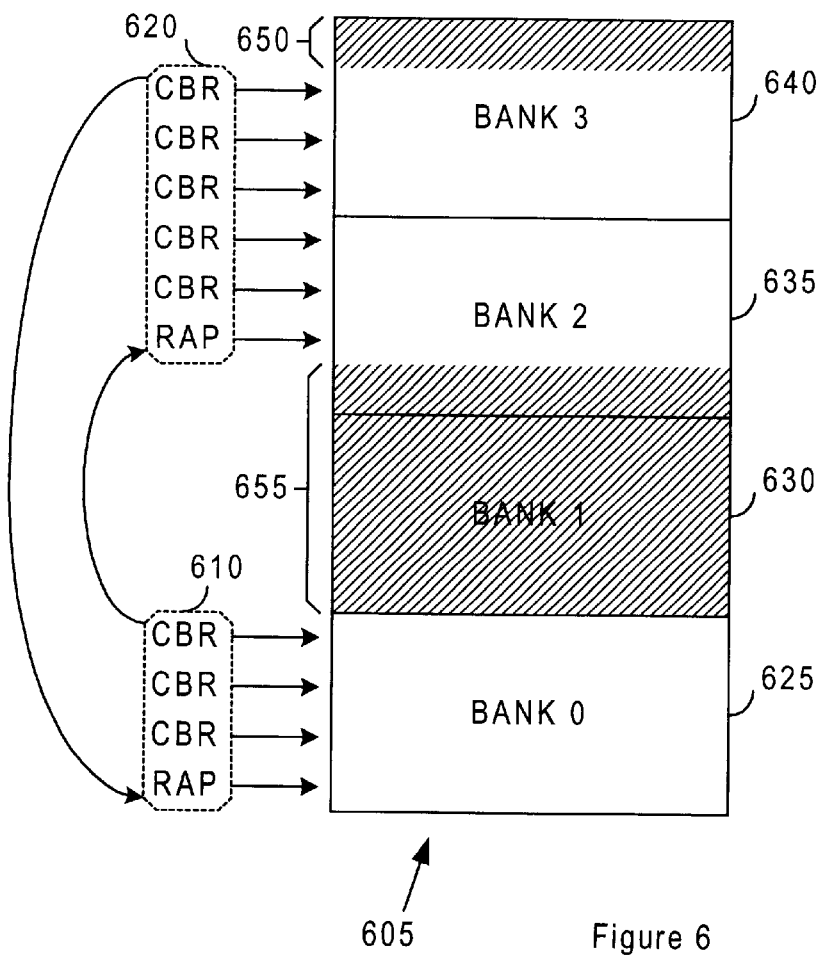
FIG. 6 illustrates the use of refresh command sequences to refresh only portions of memory used to store data according to a preferred embodiment of the present invention.

Referring now to FIG. 6, a block diagram illustrates the use of a RAP command and a sequence of CBR commands to refresh a consecutive sequence of wordlines in a memory storage device according to a preferred embodiment of the present invention. FIG. 6 illustrates a block of memory 605 comprising four individual memory banks (Bank 0 625, Bank 1 630, Bank 2 635, and Bank 3 640). FIG. 6 also illustrates two sequences of RAP and CBR refresh commands displayed as highlights 610 and 620. The first sequence 610 comprising one RAP and three CBR commands and the second sequence 620 comprising one RAP and five CBR commands.

The first sequence 610 starts with a RAP command and the user specifying a wordline address located at the bottom of Bank 0 625. After the specified wordline is refreshed, the user issues a sequence of three CBR commands to refresh three other wordlines in Bank 0, which lay in consecutive order to the specified wordline. After the first sequence 610 completes, the user starts the second sequence 620 with another RAP command, specifying a wordline located in Bank 2 635. After the RAP command completes, the user issues a sequence of five CBR commands to refresh five other wordlines. Note that the wordline refreshed by the third CBR command lies within Bank 3 640 and not Bank 2 635.

FIG. 6 additionally illustrates several blocks of unused memory, displaying them as shaded blocks 650 and 655. Note that by using the two refresh command sequences 610 and 620, the user is able to refresh the memory storage cells that require refreshing (the storage cells actually used to store data) and the unused memory storage cells are not refreshed. Because the refresh operation consumes a significant amount of power and time, a large amount of power and time can be saved, resulting in more efficient operation and longer battery life and less heat dissipation.

Figure 7:
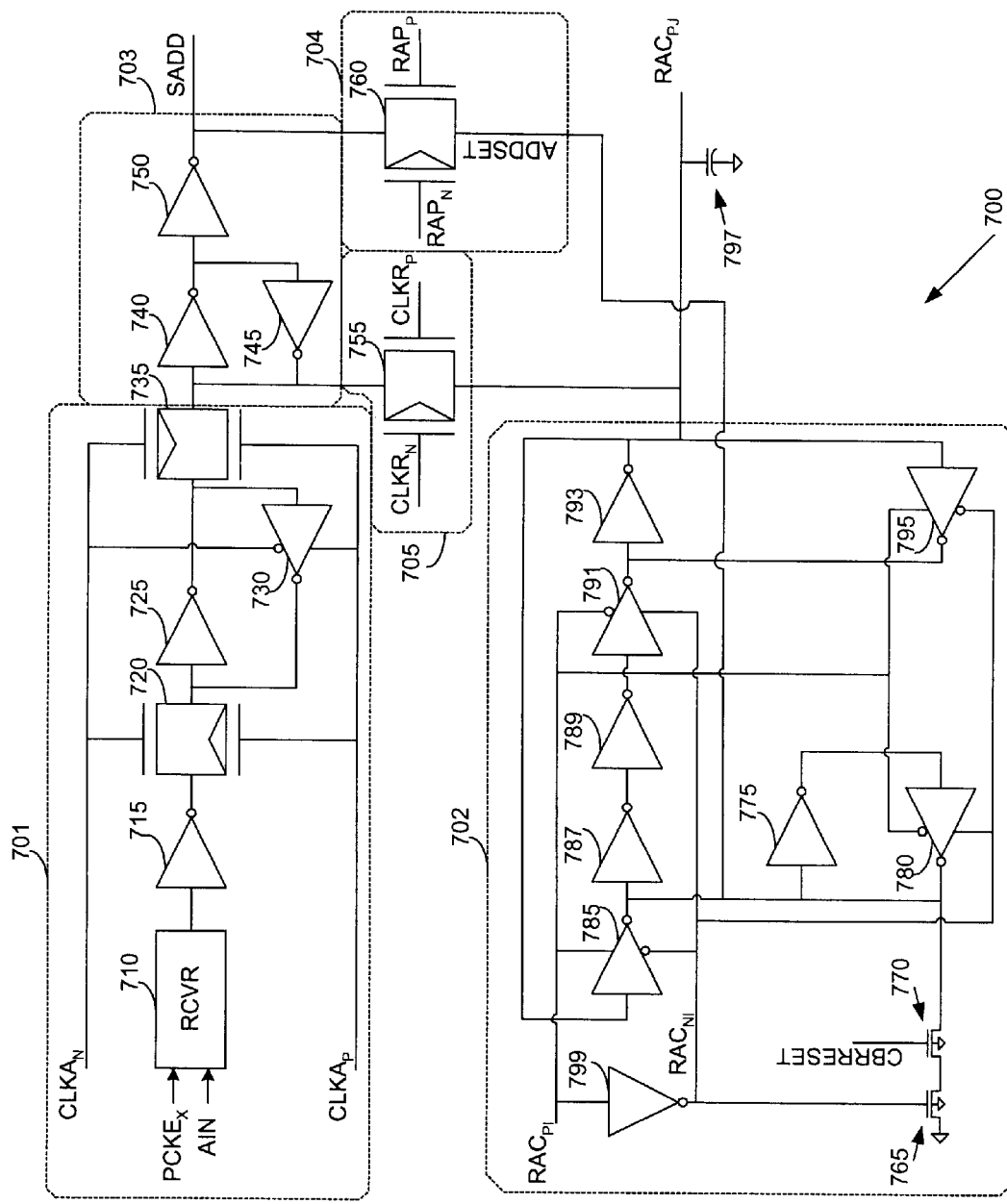
FIG. 7 illustrates an implementation of a single bit slice of a combination programmable counter and latch structure used to implement a refresh circuit with a programmable counter according to a preferred embodiment of the present invention.
Figure 8:
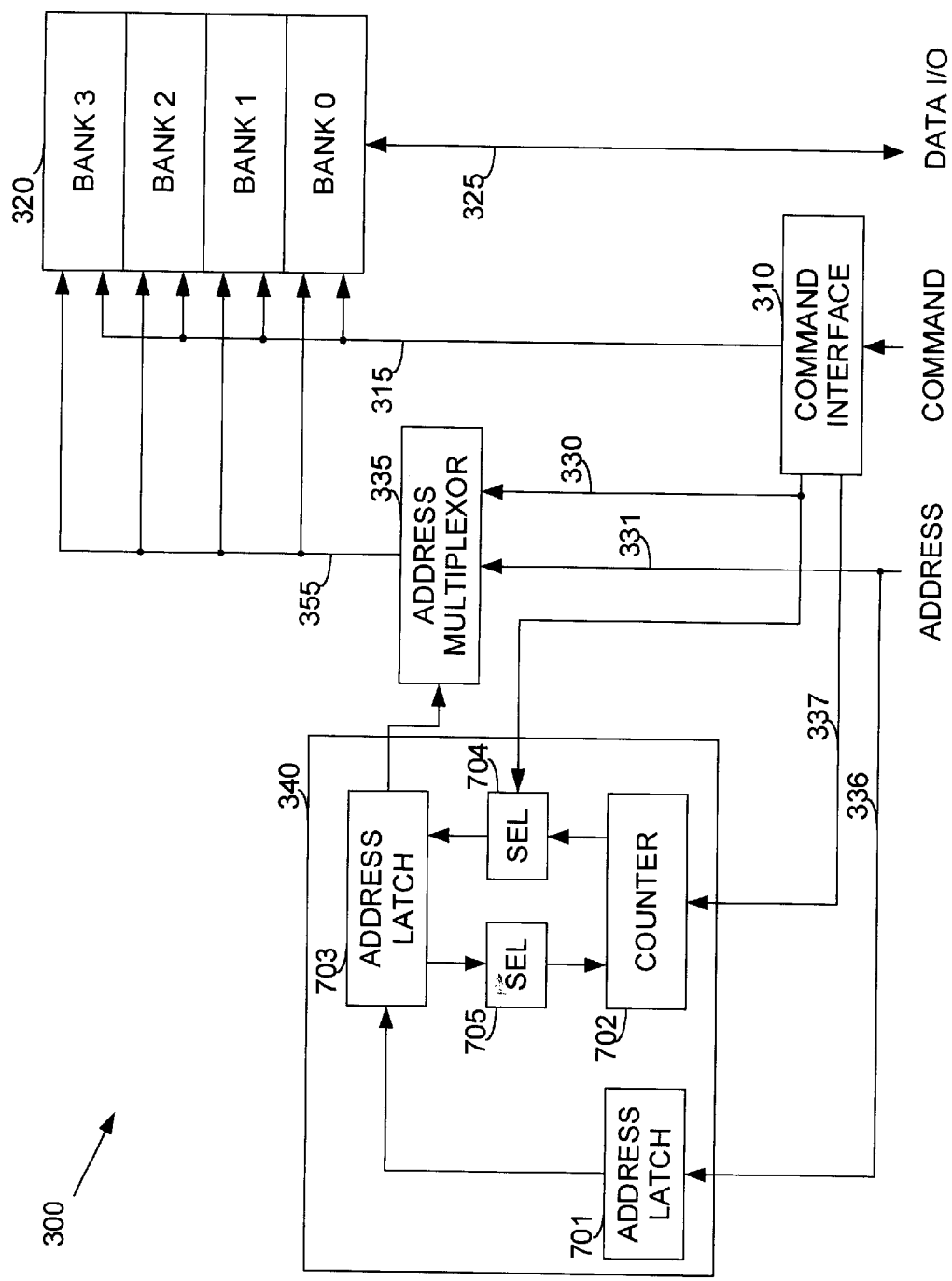
FIG. 8 illustrates a memory storage device as shown in FIG. 3 that includes the combination programmable counter and latch structure of FIG. 7.

Referring now to FIG. 7, a block diagram illustrates a single bit slice of a combination programmable counter and latch structure 700 for use in implementing a refresh circuit with programmable counter according to a preferred embodiment of the present invention. FIG. 8 illustrates the programmable counter and latch structure of FIG. 7 incorporated in the block diagram of FIG. 3. The structure 700 is a single bit slice, meaning that a series of these structures can be jointed together to form a multi-bit structure. For example, if a 16 bit programmable counter with latch structure is desired, then a series of 16 of the structures 700 can be combined together to form the 16 bit programmable counter with latch structure. The structure 700 comprising: a receiver and storage latch circuit 701, a master-slave flip-flop circuit 702, a latch and signal driver circuit 703, a first transmission gate circuit 704, and a second transmission gate circuit 705.

The receiver and storage latch circuit 701 is used to store a single bit of an external address provided by the user. A receiver 710 is used to amplify a single bit of the external address. A two cross-coupled inverters 725 and 730 are used to store the single bit value placed on the address bus, in a synchronous fashion. A transmission gate 720 permits the bit value from receiver 710 to propagate to the two cross-coupled inverters 725 and 730 when a first clock input $CLKA_N$ is high and when a second clock input $CLKA_P$ is low. A second transmission gate 735 permits the data stored in the cross-coupled inverters 725 and 730 to propagate to the latch and signal driver circuit 703 when clock input $CLKA_N$ is low and $CLKA_P$ is high. The receiver and storage latch circuit 701 can be thought of as latching a single bit of the external address with a rising edge on clock $CLKA_P$.

The master-slave flip-flop circuit 702 is constructed of two pairs of cross-coupled inverters, a first pair of cross-coupled inverters comprising inverters 775 and 780 and a second pair of cross-coupled inverters comprising inverters 793 and 795. The output of the second pair of cross-coupled inverters 793 and 795 is fed back into the input of the first pair of cross-coupled inverters. With the additional inverters 785, 787, 789, 791, and 799, the stored bit value toggles between high and low values with each low-high cycle on signal $RAC_{PI}$. The output signal $RAC_{PJ}$ connects to the input signal $RAC_{PI}$ of the next bit slice. The master-slave flip-flop circuit 702 is used to store a single bit of the programmable counter in the refresh circuit. A signal CBRRESET is used to allow the clearing of the bit stored in the master-slave flip-flop circuit 702.

The latch and signal driver circuit 703 stores the data provided by the receiver and storage latch circuit 701 in its own pair of cross-coupled inverters 740 and 745 and an additional inverter 750 inverts and amplifies the stored data to provide sufficient signal strength. The data stored in the latch and signal driver circuit 703 may be thought of as the internal address that is to be used to access a wordline in the memory storage device. It is noted that without limiting the scope of this present invention, inverters 730, 785, 791, 780, and 795 are shown as tristate inverters as they are widely known in the art. The input signals, which are switching the inverter from tristate mode into the active mode (and vice-versa), are connected vertically to the inverter on the top and bottom of the inverter.

The first transmission gate circuit 704 comprising a transmission gate 760 and a negative RAP ($RAP_N$) and positive RAP ($RAP_P$) signals permit the stored address bit (stored in the latch and signal driver circuit 703) to be stored in the master-slave flip-flop circuit 702. When $RAP_N$ is low and $RAP_P$ is high, the output SADD of the latch and signal driver circuit 703 is forced onto signal line ADDSET, which is coupled to the master-slave flip-flop circuit 702. Therefore, the content of the master-slave flip-flop circuit 702 is overwritten by the output SADD of the latch and signal driver circuit 703. The latch and signal driver circuit 703 implements the loading of the master-slave flip-flop circuit 702 with an address bit provided by the user.

The second transmission gate circuit 705 comprising a transmission gate 755 and a negative clock ($CLKR_N$) and a positive clock ($CLKR_P$) signals permit the stored internal address bit (stored in the master-slave flip-flop circuit 702) to overwrite the contents of the latch and signal driver circuit 703. When $CLKR_N$ is low and $CLKR_P$ is high, the output of the master-slave flip-flop circuit 702 overwrites the contents of the latch and signal driver circuit 703. This implements the loading of the internal address stored in the programmable counter onto the internal address bus for use in addressing a wordline, whose address is stored in the programmable counter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor memory device comprising:
    a memory comprising a plurality of memory storage cells;
    a command interface coupled to the memory, the command interface containing circuitry to decode commands provided to the device by a user and provide the decoded commands to control the operation of the device;
    a refresh circuit coupled to the memory and the command interface, the refresh circuit to provide an address of a portion of the memory to be refreshed, the refresh circuit comprising:
        a programmable counter having a first input coupled to the command interface and a second input coupled to an address bus, the programmable counter containing circuitry to store an address provided on the address bus and to provide the stored address on an output of the refresh circuit; and
        a selection circuit having an input coupled to the command interface and an output coupled to the second input of the programmable counter, the selection circuit having circuitry to pass the address provided by the address bus to the programmable counter based on a command from the command interface.

2. The semiconductor memory device of claim 1 further comprising an address multiplexor having inputs coupled to the refresh circuit, the address bus, and the command interface, and an output coupled to the memory, the address multiplexor containing circuitry to select an address from one of its inputs and providing the selected address to its output.

3. The semiconductor memory device of claim 2, wherein the input coupled to the command interface provides a signal for use in selecting the address.

4. The semiconductor memory device of claim 1, wherein the programmable counter stores an address provided on the address bus when a bank activate command is provided to the command interface by a user via a RAP command.

5. The semiconductor memory device of claim 4, wherein the command interface decodes the RAP command into two internal commands:
    a first command to store an address provided on the address bus in the programmable counter and refresh a portion of memory corresponding to the address; and
    a second command to precharge a bank of memory containing the portion of memory corresponding to the address.

6. A dynamic random access memory (DRAM) device comprising:
    a memory containing a plurality of memory cells to store binary data, each memory cell including a transistor coupled in series with a capacitor;
    a command interface coupled to the memory, the command interface containing circuitry to decode commands provided to the device;
    a refresh circuit coupled to the memory and the command interface, the refresh circuit containing circuitry to provide an address of a portion of the memory to be refreshed;
    wherein the command interface decodes a single external refresh command into first and second internal commands:
        the first internal command being a bank activate (RAS) command, activating a portion of the memory corresponding to an address received from an external address bus; and
        the second internal command being a precharge (PRE) command to the portion of memory refreshed by the RAS command.

7. The DRAM device of claim 6, wherein the RAS command causes the address provided on the address bus to be saved to a programmable counter in the refresh circuit.

8. The DRAM device of claim 6 further comprising a signal input pin coupled to the command interface, the signal input pin indicating if a RAS command decoded by the command interface is the RAS decoded from the single external refresh command.

9. The DRAM device of claim 8, wherein if the RAS command decoded by the command interface is a RAS command issued by a user, then signal input pin is asserted false.

10. The DRAM device of claim 8, wherein the signal input pin is an auto precharge input pin of synchronous DRAM circuits.

11. A method for refreshing a contiguous block of memory comprising:
   (a) specifying an address corresponding to a start of the contiguous block of memory;
   (b) issuing a first memory refresh command;
   (c) issuing a second memory refresh command; and
   (d) repeating step (c) without repeating step (a) until the contiguous block of memory is refreshed.

12. The method of claim 11, wherein the first memory refresh command uses the specified address and refreshes a portion of the contiguous block of memory corresponding to the specified address and stores the specified address in a counter.

13. The method of claim 12, wherein the first memory refresh command is a modified bank activate command (RAP command).

14. The method of claim 13, wherein the RAP command leads to the execution of a bank activate/deactivate sequence.

15. The method of claim 11, wherein the specified address is stored in a counter, and the second memory refresh command causes the stored address to be incremented and causes a portion of the contiguous block of memory corresponding to the incremented address to be refreshed.

16. The method of claim 11, wherein the specified address is stored in a counter, and the second memory refresh command causes the stored address to be decremented and causes a portion of the contiguous block of memory corresponding to the decremented address to be refreshed.

17. The method of claim 11, wherein the second memory refresh command is an auto refresh command.

18. The method of claim 11, wherein the specified address corresponds to an address of a wordline at the start of the contiguous block of memory.

19. The method of claim 18, wherein the first memory refresh command refreshes memory storage cells coupled to the wordline corresponding to the specified address.

20. The method of claim 11, wherein the specified address is stored in a counter and the second memory refresh command decrements the stored address and refreshes memory storage cells coupled to a wordline corresponding to the decremented address.

21. The method of claim 11, wherein the specified address is stored in a counter and the second memory refresh command increments the stored address and refreshes memory storage cells coupled to a wordline corresponding to the incremented address.

22. The method of claim 11 further comprising a step (e) repeating steps (a)–(d) for a remaining block of memory requiring refreshing.

23. A memory device comprising:
   an array of memory cells;
   a first address latch coupled to an address bus;
   a second address latch with a first input coupled to an output of the first address latch, the second address latch including a first output coupled to the array of memory cells;
   a counter with an address input and an address output;
   a first select circuit having an input coupled to a second output of the second address latch and an output coupled to the address input of the counter; and
   a second select circuit with an input coupled to the address output of the counter and an output coupled to a second input of the second address latch.

24. The memory device of claim 23 wherein the second select circuit comprises a transmission gate.

25. The memory device of claim 23 and further comprising a command interface, the command interface including a plurality of control lines comprising a first control line coupled to the counter and a second control line coupled to the second select circuit.

26. The memory device of claim 25 wherein the control line coupled from the command interface to the counter carries a RAC signal.

27. The memory device of claim 25 wherein the control line coupled from the command interface to the second select circuit carries a RAP signal.

28. The memory device of claim 23 wherein the array of memory cells comprises a multi-bank array of DRAM cells.

29. The memory device of claim 23 and further comprising an address multiplexer having a first input coupled to the first output of the second address latch and a second input coupled to the address bus, the address multiplexer having an output coupled to the array of memory cells.

30. The memory device of claim 23 wherein the counter comprises a programmable counter.

31. A method of refreshing a contiguous block of memory cells in a memory device, the method comprising:
   receiving an external address indicating an end-point of the contiguous block of memory cells, the external address being received from a source external to the memory device synchronously with a clock signal;
   storing the address in a programmable counter,
   refreshing memory cells corresponding to the address stored in the programmable counter;
   receiving an auto refresh command from a source external to the memory device synchronously with a clock signal;
   modifying contents of the programmable counter in response to the auto refresh command to obtain a modified address of memory cells;
   refreshing memory cells corresponding to the modified address; and
   repeating the steps of receiving an auto refresh command, modifying contents of the programmable counter, and refreshing memory cells corresponding to the modified address until all memory cells in the contiguous block are refreshed.

32. The method of claim 31 and further comprising receiving an modified bank activate command prior to storing the address in the programmable counter.

33. The method of claim 31 and further comprising decoding the modified bank activate command into first and second internal commands, the first internal command being a bank activate command and the second internal command being a pre-charge command.

* * * * *